United States Patent
Chung

(10) Patent No.: US 8,126,414 B2
(45) Date of Patent: Feb. 28, 2012

(54) ANTENNA FOR VEHICLES

(75) Inventor: Tae In Chung, Gyeongsangbuk-Do (KR)

(73) Assignee: Hyundai Motor Company, Seoul (KR)

( * ) Notice: Subject to any disclaimer, the term of this patent is extended or adjusted under 35 U.S.C. 154(b) by 555 days.

(21) Appl. No.: 12/326,378

(22) Filed: Dec. 2, 2008

(65) Prior Publication Data

US 2009/0153740 A1     Jun. 18, 2009

(30) Foreign Application Priority Data

Dec. 12, 2007   (KR) ................ 10-2007-0129282

(51) Int. Cl.
*H04B 1/06* (2006.01)
*H04B 7/00* (2006.01)

(52) U.S. Cl. .................................... 455/234.1
(58) Field of Classification Search ............. None
See application file for complete search history.

(56) References Cited

U.S. PATENT DOCUMENTS 5,959,473 A * 9/1999 Sakuragi ............. 327/111

FOREIGN PATENT DOCUMENTS

| JP | 2004-153718 A | | 5/2004 |
| JP | 2006-332770 | * | 7/2006 |
| KR | 10-2006-0086368 | | 7/2006 |

* cited by examiner

*Primary Examiner* — Lincoln Donovan
*Assistant Examiner* — Daniel Rojas
(74) *Attorney, Agent, or Firm* — Edwards Wildman Palmer LLP; Peter F. Corless

(57) ABSTRACT

An antenna for vehicles includes a first AGC unit and a second AGC unit. The first AGC unit determines the strength of a signal, which is input to the input stage of an amplifier without passing through a transistor. Depending on the determination result, the first AGC unit attenuates the signal and output the attenuated signal to the transistor. When a signal having a value equal to or greater than a reference value is input to the input stage, the second AGC unit operates so as to output the signal without passing through the transistor. According to the antenna, both signals in a strong electric field area and signals in a weak electric field area close to the strong electric field area can be effectively controlled.

4 Claims, 8 Drawing Sheets

ANTENNA FOR VEHICLES

CROSS-REFERENCE TO RELATED APPLICATIONS

This application claims under 35 U.S.C. §119(a) priority to Korean Application No. 10-2007-0129282, filed on Dec. 12, 2007, the disclosure of which is incorporated herein by reference in its entirety.

BACKGROUND

1. Technical Field

The present invention relates generally to antenna for vehicles and, more particularly, to an antenna for vehicles, in which Automatic Gain Control (AGC) function is improved, thus effectively controlling not only signals in a strong electric field area, but also signals in a weak electric field area close to the strong electric field area.

2. Related Art

With the development of technologies, the desire for entertainment using high-technology information and visual media has increased. To meet the desire, vehicle makers have applied Audio/Video (A/V) systems to vehicles. One of the important requirements of the A/V systems for vehicles is high performance and ease of installation.

Vehicle antennas developed to date include a hand-operated or automatic antenna for receiving radio signals, which has a length of around 70 cm and is mounted on a portion of the front or rear fender of a vehicle and a Television (TV) antenna combined with a radio antenna using a hot-wire structure on the rear windshield of a vehicle.

FIG. 1 is a block diagram of a conventional antenna amplifier module.

The conventional antenna amplifier module includes a slope type AGC unit (ACC1) for controlling weak electric field signals close to a strong electric field. The slope-type AGC unit is configured to have a feedback loop in such a way that a signal is detected at an amplifier output stage and then the strength of a signal to be input to an input stage is adjusted based on the strength of the signal at the amplifier output stage. The slope-type AGC unit transmits voltage, output through a detection diode and a comparator, to a Positive-Intrinsic-Negative (PIN) diode based on the strength of the output signal, so that the attenuation of the PIN diode occurs in the range of predetermined magnitudes (for example, an arbitrary value in the range from 0 dB to 10 dB) based on the magnitude of the voltage, thereby controlling the signals of a weak electric field adjacent to a strong electric field.

That is, the slope type AGC unit is configured in such a way as to detect a signal from the output stage of an amplifier and feed it back to an input terminal of the amplifier so that attenuation may occur according to the strength of the signal.

FIG. 2 is a circuit diagram showing the AGC unit of the conventional amplifier module.

The slope-type AGC unit includes a diode 210 for detecting an input signal, and a comparator 220 for comparing an input signal level with a preset signal level. For example, the comparator may be an Operational Amplifier (OPAMP: LM2904).

The operational principle of the slope type AGC unit is briefly described below.

When an input signal which exceeds a threshold range is input, a PIN diode 230, added to a Transistor (TR) input stage, compulsorily attenuates the input signal so that only a signal having a desired level can be input.

A Frequency Modulated (FM) output signal passes through a Schottky Diode 210 which is configured to perform rectification into a Direct Current (DC) level, and then enters a Schmidt trigger comparator 220 which is configured using an LM2904 OPAMP. The comparator 220 compares the DC level of the signal with a reference DC value which will be used as threshold voltage, and then outputs an output signal.

Since a problem may occur in that an output value continuously varies at the level near noise and threshold, the comparator is configured using a Schmidt trigger having positive feedback. The Schmidt trigger comparator can adjust reference voltage which will be used as threshold voltage by adjusting a resistor 240.

FIG. 3 is a graph showing the AGC operational characteristics of the above-described AGC unit.

When the strength of an output signal increases, voltage over the PIN diode 230 of FIG. 2 increases. Therefore, the attenuation of the PIN diode increases, so that a slope-type operational characteristic appears. The slope type, in which attenuation gradually occurs when a level which is equal to or higher than a predetermined signal enters in the form of feedback of the output signal, is an AGC type which is suitable for controlling the signals of a weak electric field adjacent to a strong electric field.

However, since the strength of a signal is determined at an amplifier output stage, the conventional AGC circuit has problems in that the operation of an AGC unit may be affected by noise depending on an amplifier amplification degree, in that it is not suitable for controlling strong electric field signals, and in that amplification output which exceeds the P1 dB of a TR may occur when a signal, the degree of which is equal to or higher than the amplifier amplification degree, is input.

The above information disclosed in this Background section is only for enhancement of understanding of the background of the invention and therefore it may contain information that does not form the prior art that is already known in this country to a person of ordinary skill in the art.

SUMMARY

One of the objects of the present invention is to provide a vehicle antenna, in which AGC function of the amplifier module is improved, thereby effectively controlling strong electric field signals as well as the signals of a weak electric field adjacent to a strong electric field.

One aspect of the present invention provides an antenna for vehicles, comprising: a transistor; a first Automatic Gain Control unit that attenuates an input signal from an amplifier input terminal and outputs the attenuated signal in the case that the value of the input signal exceeds a threshold value; and; and a second Automatic Gain Control unit that outputs the signal of the first Automatic Gain Control unit without making the signal pass through the transistor if when the value of the output signal of the first Automatic Gain Control unit is over a predetermined value.

Preferably, the second Automatic Gain Control unit may comprise a switching diode being able to be turned off so as not to make the output signal of the first Automatic Gain Control unit pass through the transistor if when the value of signal of the first Automatic Gain Control unit is over the predetermined value.

Preferably, the second Automatic Gain Control unit may comprise a comparator for comparing the value of the output signal of the first Automatic Gain Control unit with the predetermined value.

Preferably, the second Automatic Gain Control unit may comprise a Schottky diode for rectifying the output signal of the first Automatic Gain Control unit to a level of DC and producing the rectified signal as a new input signal.

Preferably, the value of the input signal at the input terminal of the amplifier becomes attenuated gradually and the value of the output of the first Automatic Gain Control unit becomes attenuated at a time.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
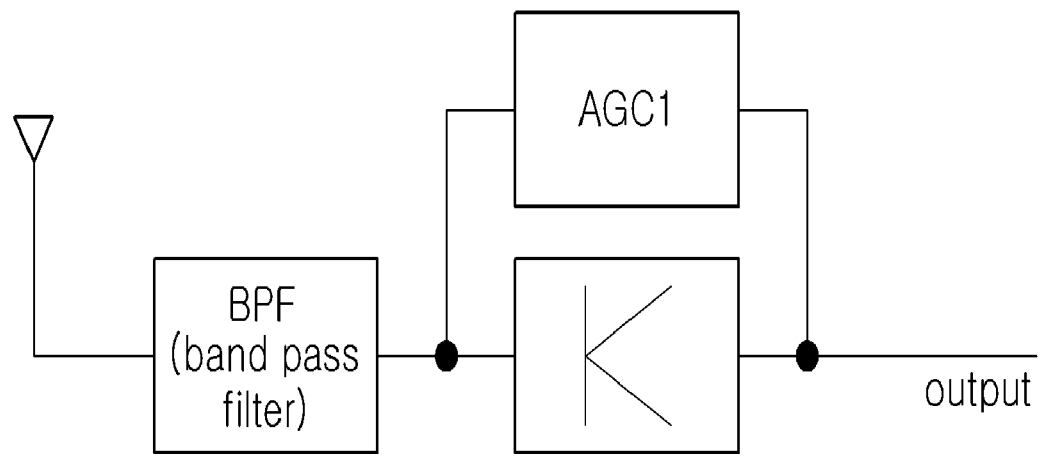
FIG. 1 is a block diagram of a conventional antenna amplifier module.
Figure 2:
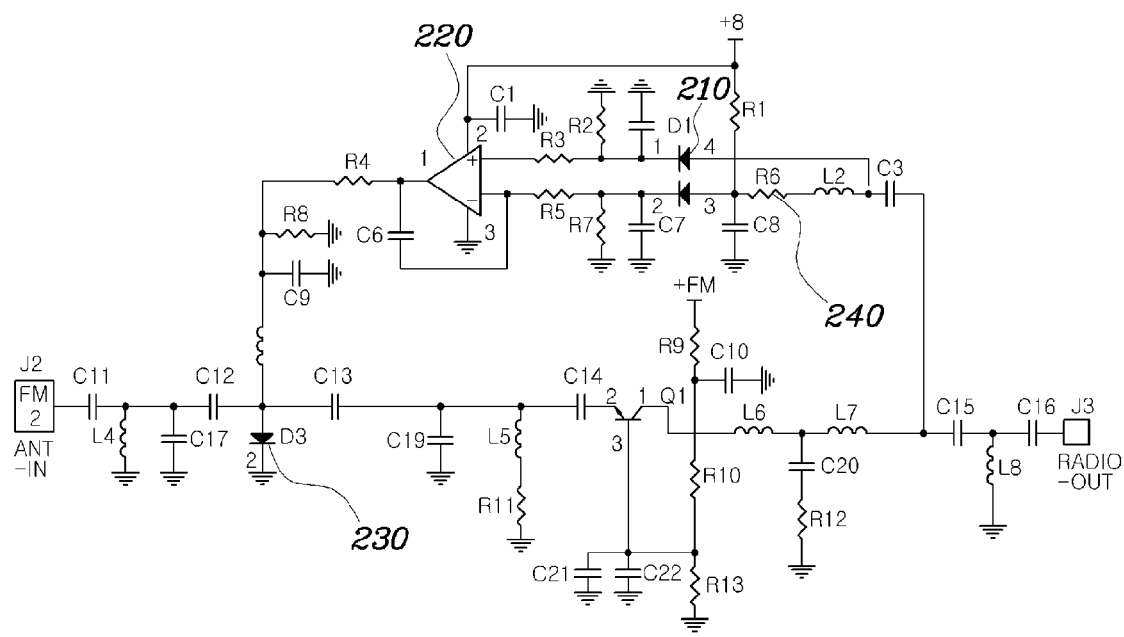
FIG. 2 is a circuit diagram showing the AGC unit of the conventional antenna amplifier module.
Figure 3:
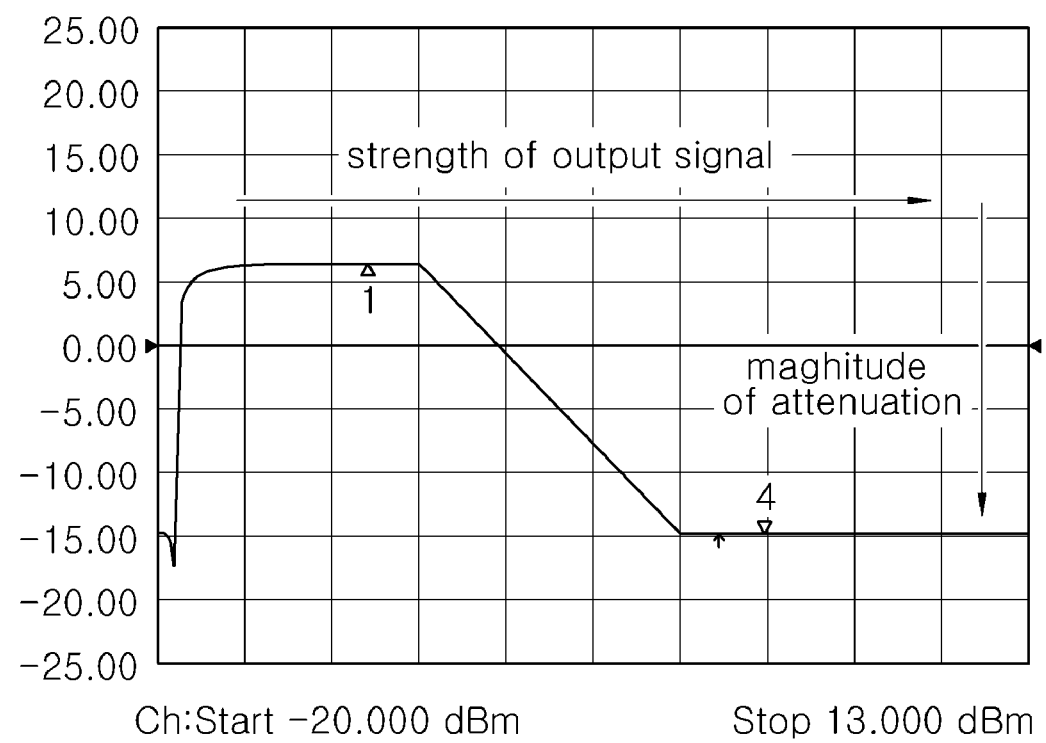
FIG. 3 is a graph showing the operating characteristic of the AGC unit of FIG. 2.

Reference now should be made to the drawings, in which the same reference numerals are used throughout the different drawings to designate the same or similar components.

Figure 4:
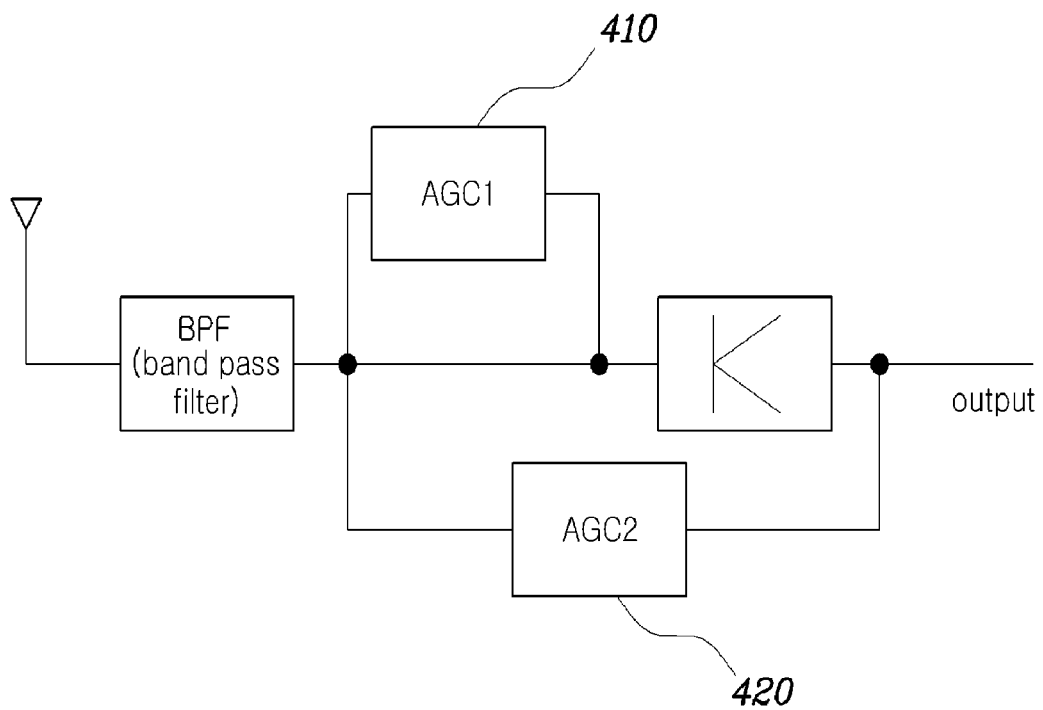
FIG. 4 is a block diagram showing an antenna amplifier module according to an embodiment of the present invention.

FIG. 4 is a block diagram showing an antenna amplifier module according to an embodiment of the present invention.

The antenna amplifier module includes On/Off-type AGC unit comprising AGC 1 410 and AGC 2 420. The AGC 1 410 is configured in the form of a circuit that can determine the strength of an input signal from an amplifier input stage and, if the strength of the input signal exceeds a threshold value, then perform attenuation while a TR is not passed through. The AGC 2 420 is configured in the form of a switching circuit that can transmit the input signal directly to the output stage of the amplifier when the input signal has a strength which is equal to or greater than a predetermined strength.

That is, the AGC 1 410 operates according to the strength of an input signal, and the AGC 2 420 operates when an input signal having a level equal to or higher than a predetermined level enters. A signal that is output via a detection diode and a comparator is attenuated according to the strength thereof without passing through an amplifier, and is then transmitted to the output stage of the amplifier.

Figure 5:
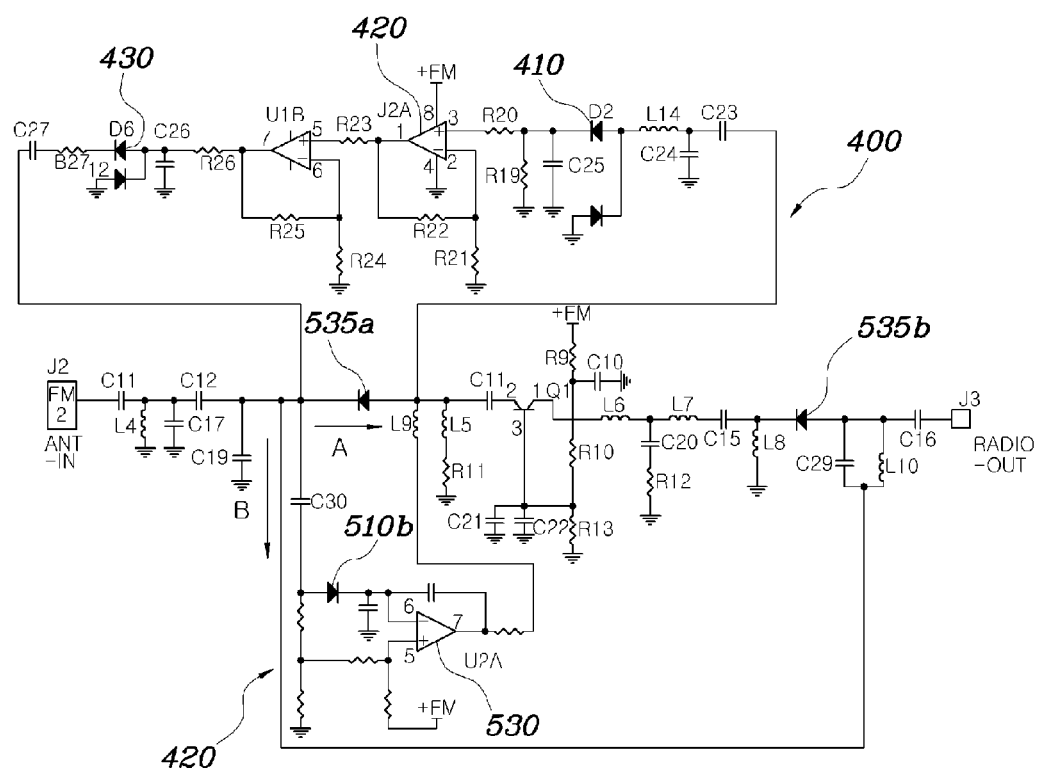
FIG. 5 is a diagram showing the AGC circuit of the antenna amplifier module according to the embodiment of the present invention.

FIG. 5 is a diagram showing the AGC circuit of the antenna amplifier module according to the embodiment of the present invention. In FIG. 5, reference numeral 410 indicates a circuit of the AGC 1, and reference numeral 420 indicates a circuit of the AGC 2.

In the AGC 1 410, a PIN diode 520 is added to the input stage of the amplifier. Accordingly, when an input signal has a strength that exceeds a threshold value, the input signal is forcibly attenuated, thereby ensuring that only signals having a predetermined level can be input. The following Table 1 shows the measurement results of the degree of attenuation according to voltage over the PIN diode 520.

TABLE 1

| AGC voltage output | PIN diode attenuation |
| --- | --- |
| 0 V | 0 dB |
| 0.5 V | −5 dB |
| 0.7 V | −10 dB |
| 0.8 V | −20 dB |

An FM output signal is input to an LM2904 operational amplifier 515 via a Schottky diode 510*a* for rectifying a power signal output through a coupling capacitor into a DC signal.

Accordingly, as the gain of the operational amplifier increases in proportion to an increase in the level of the input signal, the output voltage thereof increases. The increase in output voltage increases the attenuation by the PIN diode 520, thus attenuating the signal to be input to the transistor. As a result, a slope in which the attenuation by the PIN diode increases as the gain of the operational amplifier, that is, the voltage value, gradually increases is achieved. The operational amplifier is constructed using a two-stage operational amplifier. This serves to achieve a stable output gain.

When a signal having a strength equal to or greater than a predetermined signal strength is input, the second AGC unit 420 causes the signal to be directly transmitted to the output stage without passing through the transistor using a switching diode. Unlike the conventional system, the system according to the present invention performs signal switching without using a PIN diode.

When a signal input to the comparator is lower than a preset level, the comparator generates a high output voltage (e.g., 3.75 V), the switching diode 535 maintains an On-state, with the result that the signal is input to the amplifier in the direction A. In contrast, when the signal is equal to or higher than the preset level, the comparator generates a low output voltage (e.g., 0 V) and the switching diode 535 maintains an Off-state, with the result that the signal is transmitted to the output stage in the direction B without passing through the amplifier.

Figure 6:
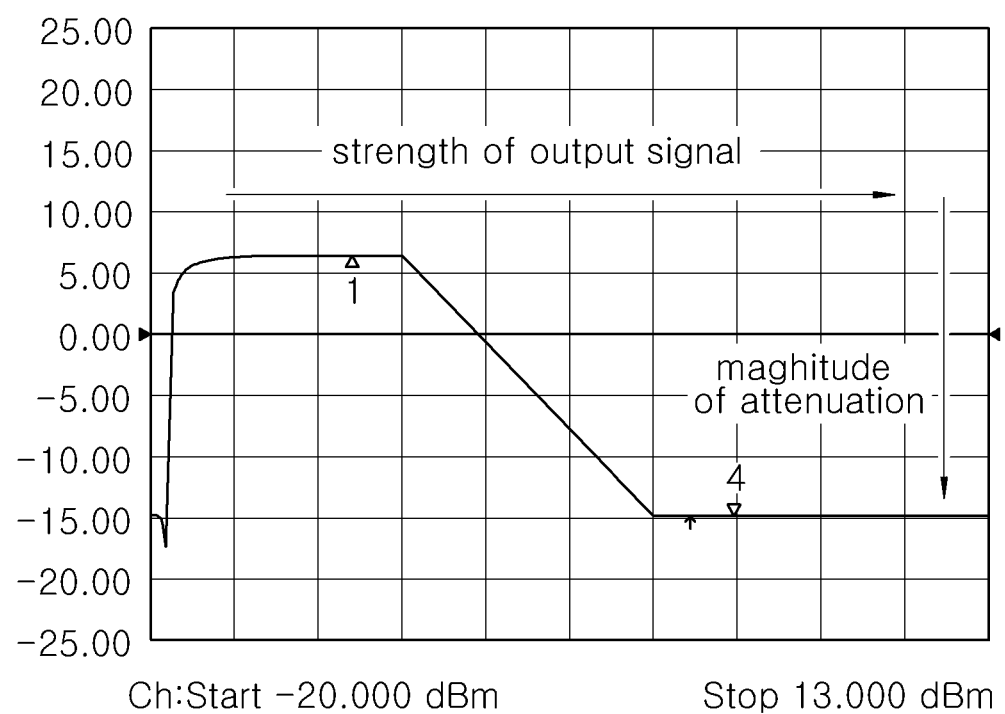
FIG. 6 is a graph showing the operating characteristic of AGC 1 of the antenna amplifier module according to the embodiment of the present invention.
Figure 7:
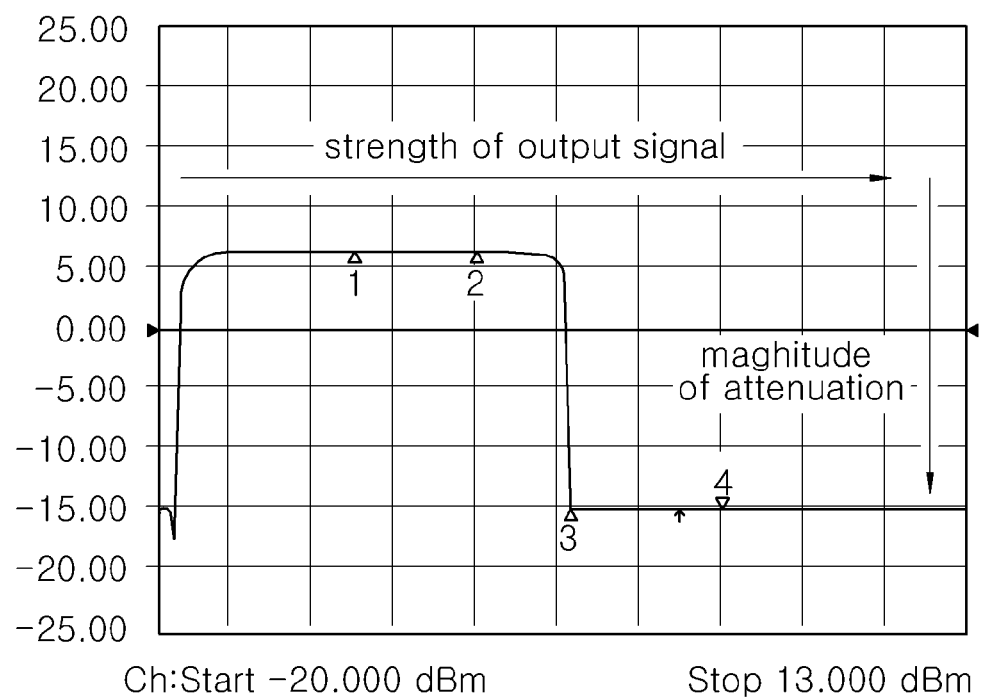
FIG. 7 a graph showing the operating characteristic of AGC 2 of the antenna amplifier module according to the embodiment of the present invention.
Figure 8:
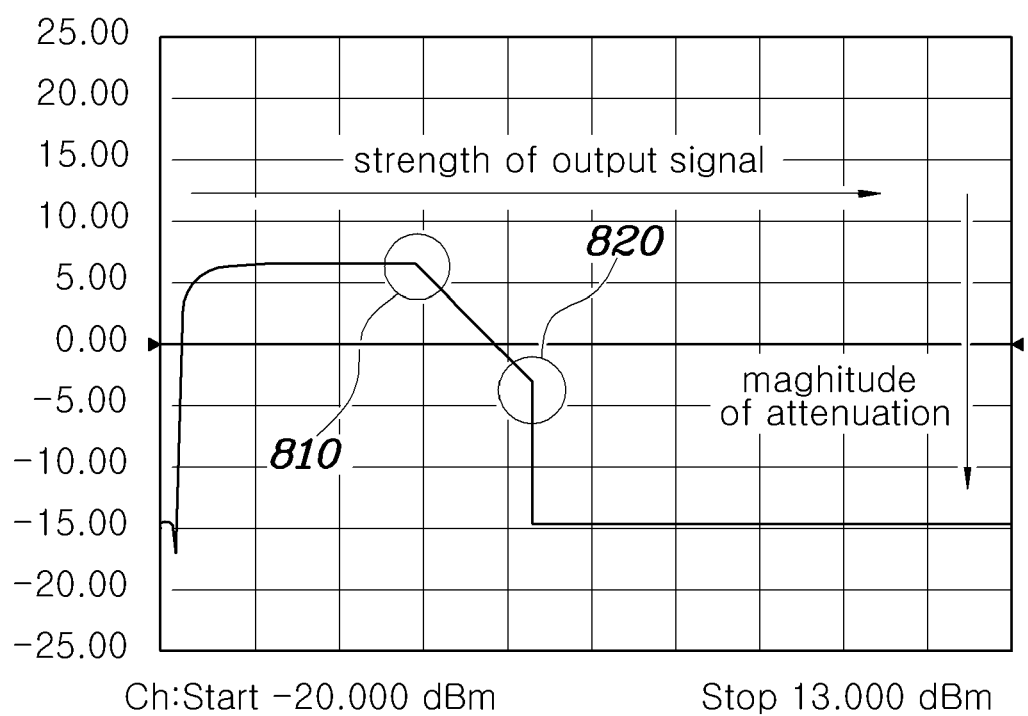
FIG. 8 is a graph showing the final output characteristic of the antenna amplifier module according to the embodiment of the present invention.

FIG. 6 and FIG. 7 are graphs showing the operational characteristics of the AGC 1 and AGC 2, respectively of the antenna amplifier module according to the embodiment of the present invention. FIG. 8 is a graph showing the final output characteristic of the antenna amplifier module according to the embodiment of the present invention.

With reference to the operational characteristic graph of FIG. 6, the operational characteristics are the same as in the above-described related art even though circuits are different from each other. When the strength of the output signal increases, voltage over the PIN diode 520 of the AGC 1 increases, thereby increasing the attenuation by the PIN diode 520. As a result, a slope operating characteristic is realized. The slope type characteristic, in which attenuation gradually occurs when an output signal having a level which is equal to or higher than a predetermined signal enters, is suitable for controlling the signals of a weak electric field adjacent to a strong electric field.

As shown in FIG. 7, when a signal having a strength equal to or higher than a predetermined value is input, the path of the signal changes from 'Active' to 'Passive' due to the switching diode, which causes the attenuation to occur rapidly. This characteristic is suitable for controlling strong electric field signals.

FIG. 8 is a graph showing an operating characteristic of the antenna amplifier module comprising the AGC 1 410 and AGC 2 420 in a hybrid form. As shown in FIG. 8, both gradual attenuation and sharp attenuation can be realized. That is, the AGC 1 410 operates in a portion indicated by reference numeral 810 in case an input signal has a strength equal to or higher than a predetermined value, and the AGC 2 420 operates in a portion indicated by reference numeral 820 in case the input signal has a strength equal to or higher than a higher predetermined value. With the antenna amplifier module, both strong electric field signals and weak electric field signals adjacent to the strong electric field can be controlled.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. An antenna for vehicles comprising:
 a transistor;
 a first Automatic Gain Control unit that attenuates an input signal from an amplifier input terminal and outputs the attenuated signal when a value of the input signal exceeds a threshold value; and,
 a second Automatic Gain Control unit that outputs the signal of the first Automatic Gain Control unit without making the signal pass through the transistor when the value of the output signal of the first Automatic Gain Control unit is greater than a predetermined value, wherein the second Automatic Gain Control unit includes a switching diode being able to be turned off so as not to make the output signal of the first Automatic Gain Control unit pass through the transistor when the value of the output signal of the first Automatic Gain Control unit is over the predetermined value.

2. The antenna for vehicles as set forth in claim 1, the second Automatic Gain Control unit comprises a comparator for comparing the value of the output signal of the first Automatic Gain Control unit with the predetermined value.

3. The antenna for vehicles as set forth in claim 1, the second Automatic Gain Control unit comprises a Schottky diode for rectifying the output signal of the first Automatic Gain Control unit into a Direct Current signal and producing the rectified DC signal as a new input signal.

4. The antenna for vehicles as set forth in claim 1, the value of the input signal at the input terminal of the amplifier becomes attenuated gradually and the value of the output of the first Automatic Gain Control unit becomes attenuated at a time.

* * * * *